United States Patent [19]
Dhaka et al.

[11] 3,823,349
[45] July 9, 1974

[54] INTERCONNECTION METALLURGY SYSTEM FOR SEMICONDUCTOR DEVICES

[75] Inventors: Vir A. Dhaka, Hopewell Junction; Andrew F. Kozik, Poughkeepsie, both of N.Y.

[73] Assignee: International Business Machines Corporation, Armonk, N.Y.

[22] Filed: May 17, 1972

[21] Appl. No.: 254,322

Related U.S. Application Data

[62] Division of Ser. No. 4,966, Jan. 22, 1970, Pat. No. 3,681,147.

[52] U.S. Cl..... 317/234 R, 317/234 N, 317/235 AG
[51] Int. Cl. .............................................. H01l 7/00
[58] Field of Search ............... 317/234, 235, 5.4, 46

[56] References Cited

UNITED STATES PATENTS 3,351,825 11/1967 Vidas .................................. 317/234
3,556,966 1/1971 Waxman et al.................... 204/164
3,634,203 1/1972 McMahon et al. .................. 204/15

*Primary Examiner*—Rudolph V. Rolinec
*Assistant Examiner*—E. Wojciechowicz
*Attorney, Agent, or Firm*—Wolmar J. Stoffel

[57] ABSTRACT

Semiconductors having very narrow base widths can be fabricated by using ion implantation through the contact metallization as a mask, then expanding and passivating the metallization by anodization so as to protect the semiconductor junction.

Aluminum metallization has predictable expansion characteristics as it oxidises or is anodized, and the oxide has insulating properties. This predictable expansion of aluminum oxide permits a dynamic control of the size and shape relationship between adjacent semiconductive regions such as emitter and base or base-collector. The expansion of the contact metallization provides a mask opening with closely corresponding dimensions and permits very close control of narrow semiconductor regions.

4 Claims, 20 Drawing Figures

FIG. 3.01
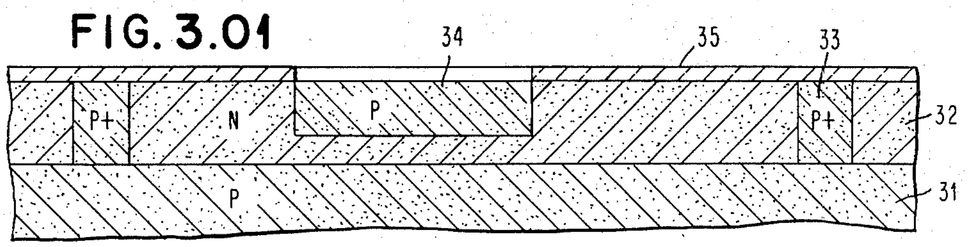
FIG. 3.02
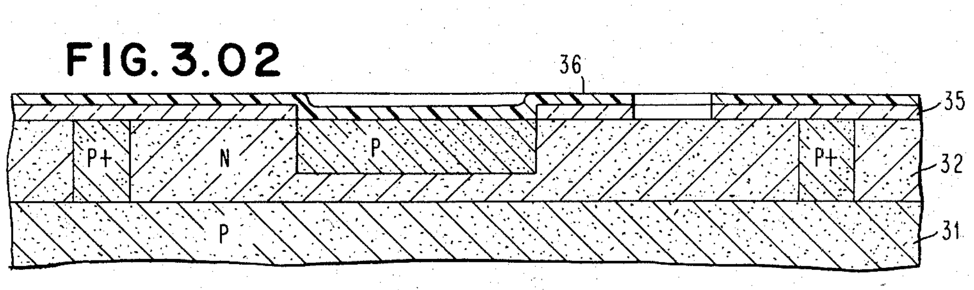
FIG. 3.03
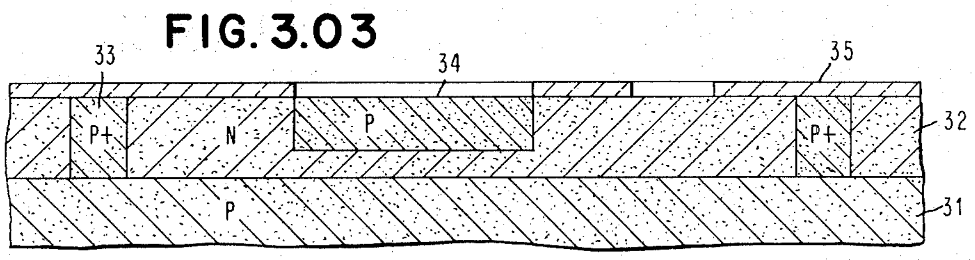
FIG. 3.04
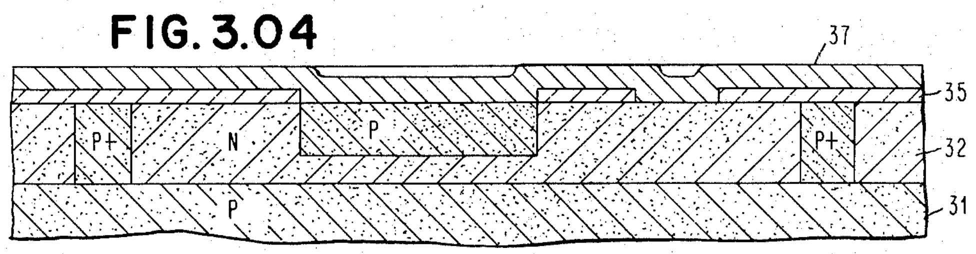
FIG. 3.05
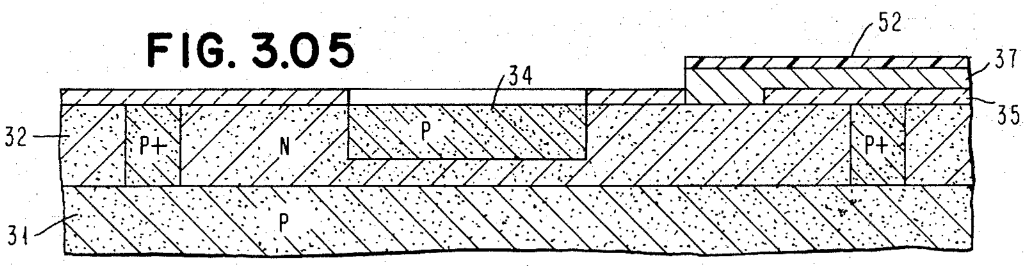

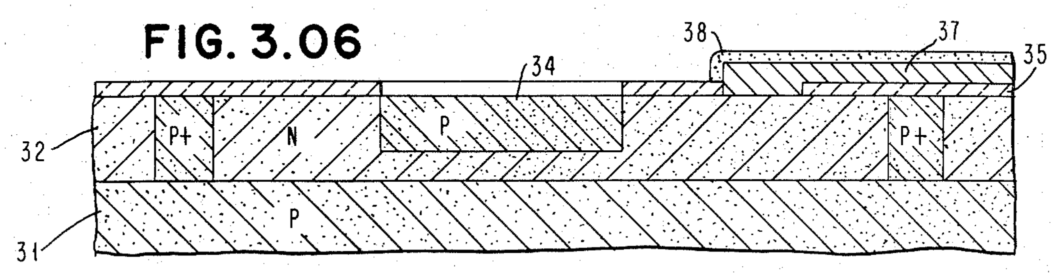
FIG. 3.06
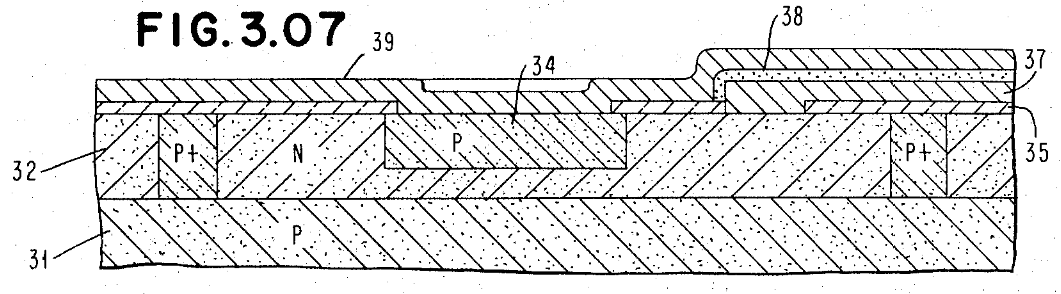
FIG. 3.07
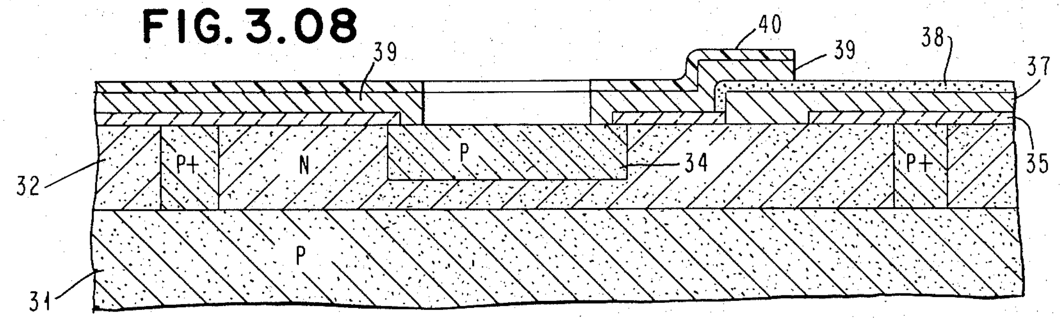
FIG. 3.08
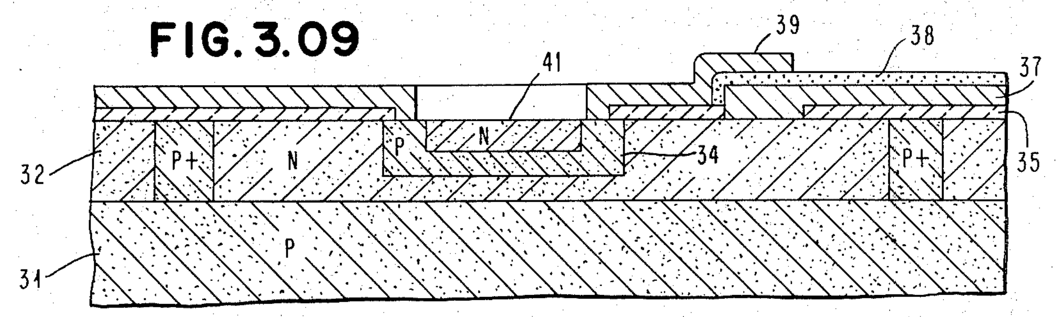
FIG. 3.09

FIG. 3.10
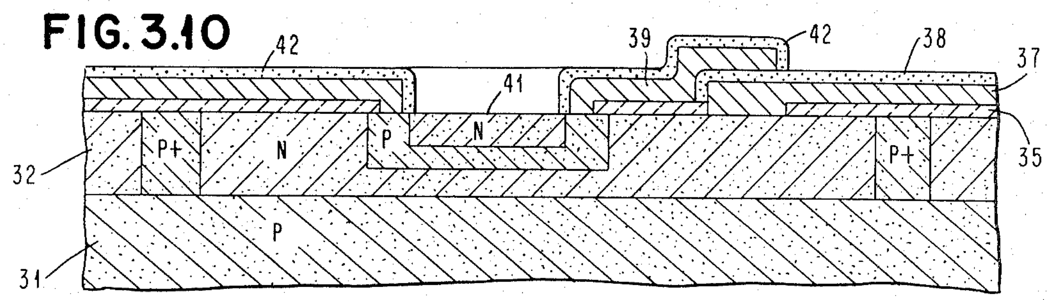
FIG. 3.11
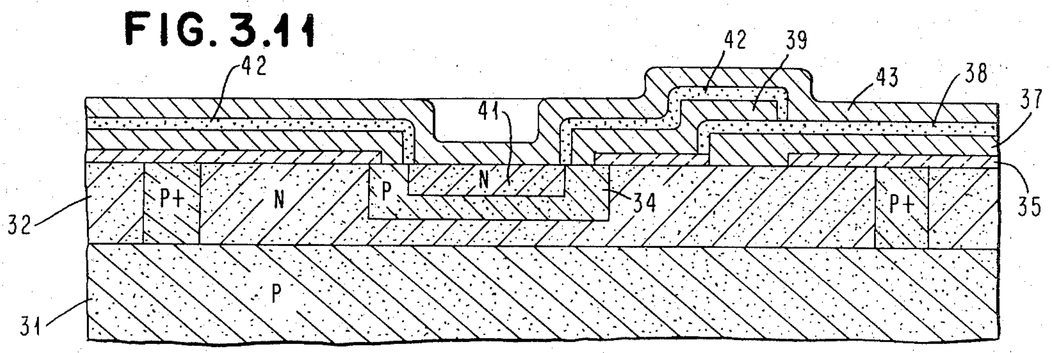
FIG. 3.12
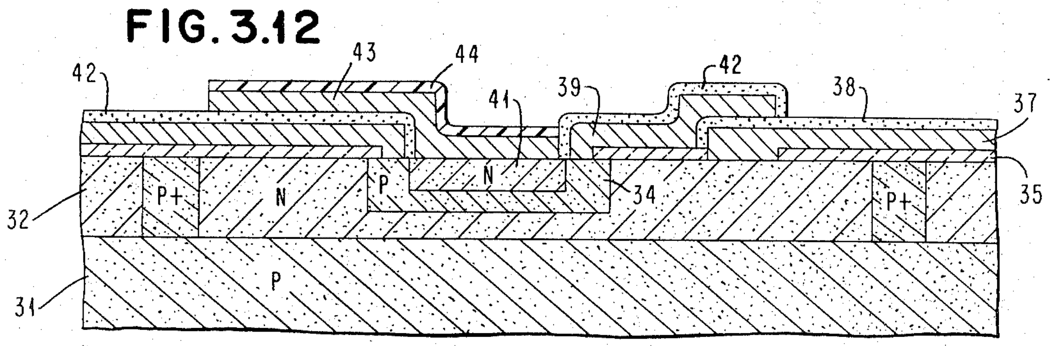
FIG. 3.13
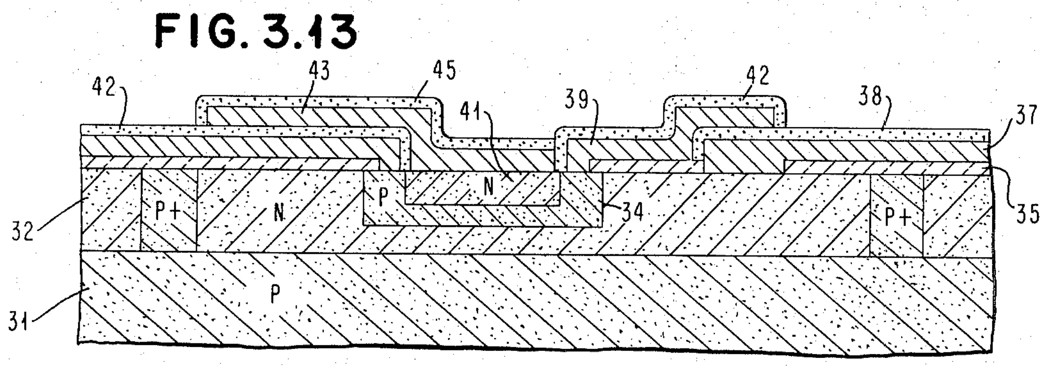

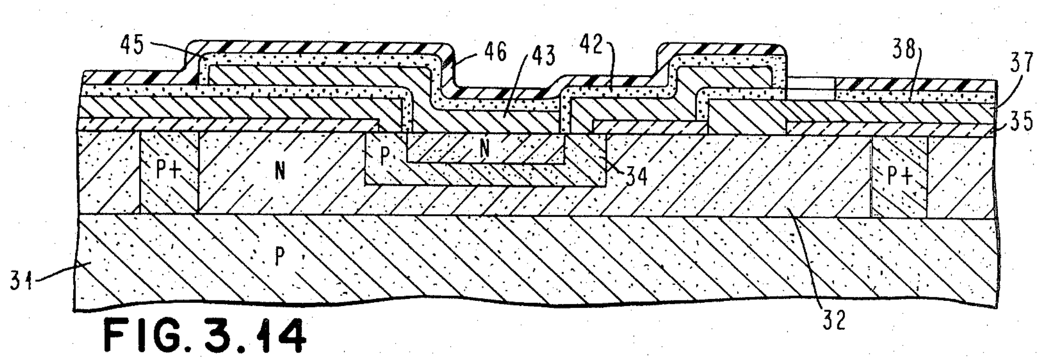
FIG. 3.14
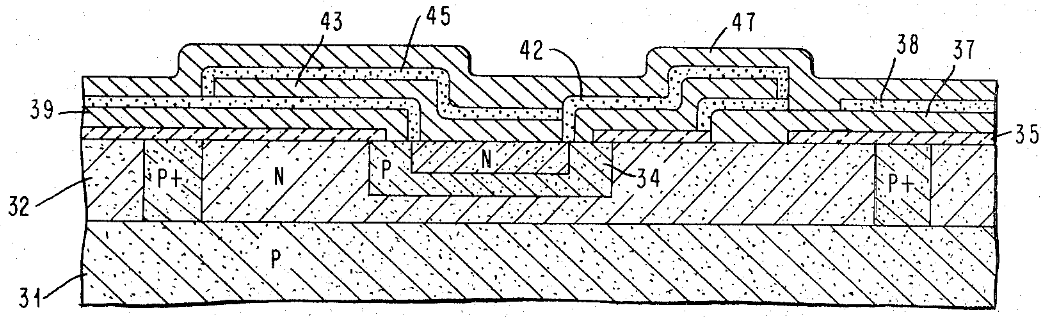
FIG. 3.15
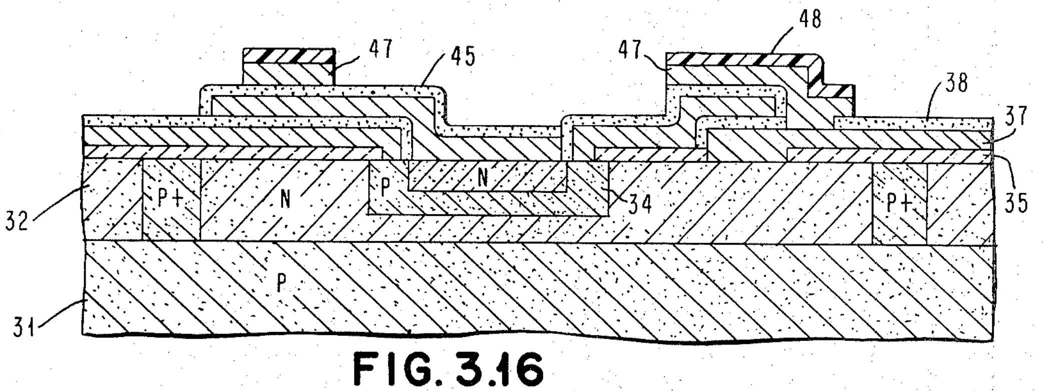
FIG. 3.16
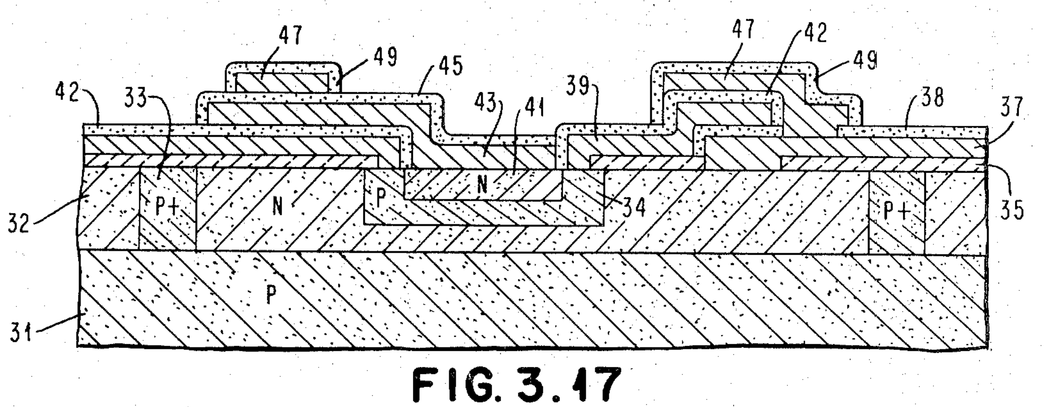
FIG. 3.17

INTERCONNECTION METALLURGY SYSTEM FOR SEMICONDUCTOR DEVICES

This is a divisional application of Application Ser. No. 4,966 filed Jan. 22, 1970, now U.S. Pat. No. 3,681,147.

BACKGROUND OF THE INVENTION

A planar semiconductor structure is produced with minimum difficulty by utilizing the contact metallization as a mask for impurity implantation. Ion implantation of semiconductor impurities provides a very sharp profile of undoped and doped areas. Ion implantation is a straight line phenomenon, with minimum spreading, and is carried out at temperatures lower than required for significant lateral diffusion of implanted impurities.

This invention relates to a method of making semiconductors and to semiconductors prepared by the method. Planar semiconductors are prepared by a series of mask and diffusion steps. It is desirous to make the devices smaller but this becomes difficult because a minimum spacing must be maintained between metallization of the emitter and the base or collector and base. Ion implantation, because of its inherent minimum spreading characteristic, permits finer geometries to be made. Masks are costly and it is difficult to maintain the dimensional and alignment characteristics required for fine geometric patterns required in the manufacture of semiconductor structures by conventional techniques.

SUMMARY OF THE INVENTION

Accordingly, it is an object of the invention to provide for the manufacturing of semiconductor integrated circuits by minimizing mask registration problems by the actual use of the mask as the contacting and interconnecting medium of the integrated device structure.

The objects of the invention are carried out by using the actual contact metallization to selected semiconductor regions to provide masking for subsequent process steps in the creation of integrated semiconductor structures.

This is accomplished by taking advantage of expansion characteristics of the contact metallization to provide masking and isolation over desired semiconductor regions.

Ion implantation is not normally subject to spreading by the diffusion process because the ions are projected into the semiconductor mask in a straight line fashion at relatively low temperatures where significant diffusion spreading does not take place. The relative placement of the emitter and base region is also subject to control by control of dimensions of the metallization pattern through an expansion technique involving oxidation or anodization.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIGS. 3.01 to 3.17 illustrate the steps taken in producing a semiconductor integrated circuit according to the invention. The figures show the semiconductor integrated circuit at the end of representative steps in its creation.

SEMICONDUCTOR

Figure 1:
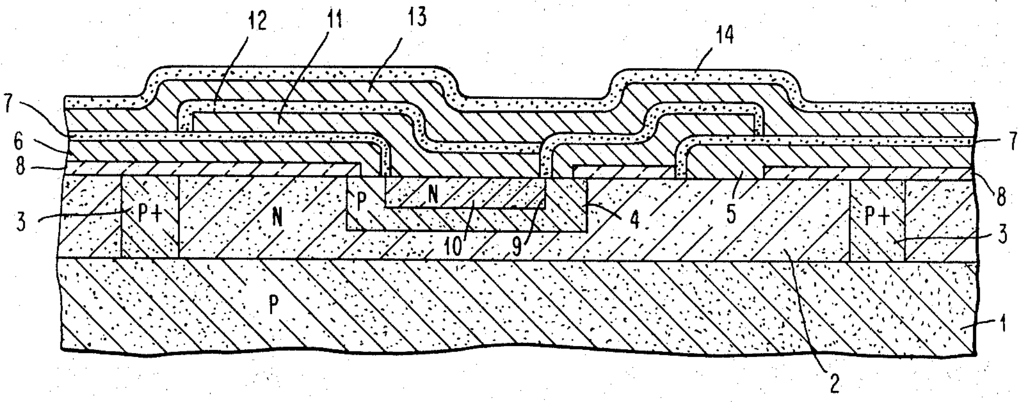
FIG. 1 is a diagram of a semiconductor produced by the techniques of the invention.

FIG. 1 is a simplified drawing of a device according to the invention. The device comprises a block of P type semiconductor material 1, having an epitaxial layer 2 of N type semiconductor material, which serves as the collector. Diffused into epi layer 2 are a P+ doped semiconductor isolation region 3. An additional P semiconductor region 4 is implanted in semiconductor region 2, to serve as the base. Aluminum metallization pattern 5 makes ohmic contact to collector semiconductor region 2 and aluminum metallization pattern 6 makes ohmic contact to base semiconductor region 4. Metallization patterns 5 and 6 are isolated from each other by aluminum oxide layer 7 which is relatively nonconductive and from epitaxial semiconductor 2 by sputtered oxide layer 8. Emitter 10 is a region of N type semiconductor forming a junction 9 with base region 4. The emitter is made by ion implantation using a window in base metallization 6 as the pattern. The junction 9 between emitter 10 and base 4 is protected by aluminum oxide layer 7 which has been made by anodizing aluminum layer 6. Oxide layer 7 covers junction 9 between semiconductor regions 4 and 10, thereby preventing metallization pattern 6 from short-circuiting across junction 9 while controlling the base width to a minimum. Emitter metallization 11 contacts emitter 10 and is protected by aluminum oxide layers 7 and 12. Further aluminum layer 13 and its protective oxide layer 14 are arranged to provide necessary interconnections to other metal layers for characterizing the device.

EXPANSION ANODIZATION

Figure 2A:
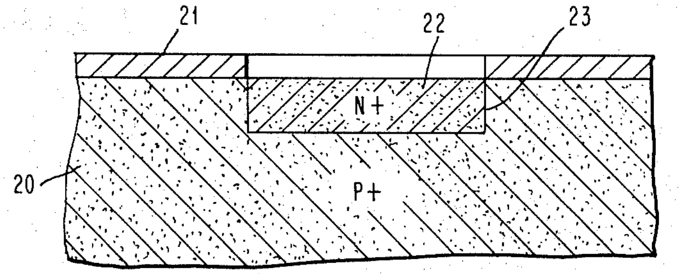
FIGS. 2A and 2B are simplified diagrams of expansion through anodization of a metallized pattern.
Figure 2B:
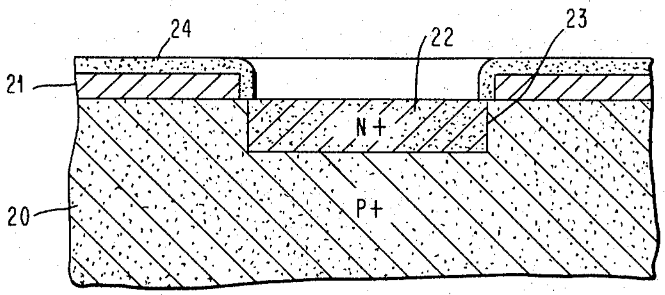

FIG. 2A shows a greatly simplified semiconductor block 20 which has an applied metallization pattern 21 which has an aperature defining the area of a second semiconductor region 22, which forms junction 23 with the semiconductor material to block 20. FIG. 2B shows the same device after an anodization step. The anodization step causes metallization pattern 21 to recede slightly away from junction 23 between semiconductor regions 20 and 22. At the same time the anodization step causes oxide layer 24 to form which expands so that the total anodization is greater than that of metallization layer 21 prior to anodization. This relationship dependably provides an oxide layer 24 covering the junction 23 as the metallization pattern 21 recedes away from its previous edge. Careful control of the amount of oxide built up by the anodization process, maintained through time, voltage, pressure, temperature controls, permits the control of the location of the oxide layer so that it may be controllably positioned athwart the junction.

DETAILS OF PROCESS

The process according to the invention begins with a preprocessed silicon wafer as shown in FIG. 3.01. The wafer includes P type semiconductor body 31 upon which has been grown an N type epitaxial layer 32. Epitaxial layer 32 has been provided with P+ semiconductor isolation region 33 and with a suitable pattern of P type semiconductor regions 34. The entire unit is covered with silicon oxide layer 35 which is of lesser thickness over P type semiconductor region 34 than over the rest of the unit. While several steps have been necessary to bring the semiconductor unit into the condition shown in FIG. 3.01 these steps are conventional. See for example, Integrated Circuit Engineering, Basic Technology, Boston Technical Publishers, Inc., Cambridge, Mass. 1966, Chapter 4, Silicon Wafer Processing.

FIG. 3.02 shows the same semiconductor unit as in FIG. 3.01 after an additional step of applying a photoresist (such as KPR) masking, exposing and etching to provide for collector contacts. Photoresist layer 36 has been exposed and etched to define a path through oxide layer 35 to collector 32.

FIG. 3.03 shows the same semiconductor unit with photoresist layer 36 stripped off.

FIG. 3.04 shows the same semiconductor unit with a layer of aluminum 37 deposited over its surface to form the collector contact and interconnection metallization.

FIG. 3.05 shows the same semiconductor after a photoresist, mask, expose and etch step for the collector and collector interconnection metallization. Photoresist layer 52 has been removed except in those areas where aluminum layer 37 is to be retained for the collector contact and interconnection.

FIG. 3.06 shows the same semiconductor unit after the additional step of stripping the photoresist and anodizing aluminum metallization 37 to provide aluminum oxide layer 38.

FIG. 3.07 shows the same semiconductor unit with an overlying layer of aluminum 39 which forms the base contact and interconnection metallization.

FIG. 3.08 shows the same semiconductor unit after a photoresist, mask, expose and etch step has defined the base metallization 39 with the necessary personality and with an emitter window opening to P type semiconductor base region 34. Photoresist layer 40 remains in place over the unetched portion of metal layer 39.

FIG. 3.09 shows the same semiconductor unit after the step of stripping the photoresist and ion implanting emitter region 41 within the area of base region 34 defined by the window opening through base metallization 39. The emitter is doped with phosphorous to a depth of 20 microns less than the depth of base diffusion 34, providing a base width of 20 microns. There is no appreciable spreading of ion implanted emitter region 41 because of the relatively low temperatures involved.

FIG. 3.10 shows the same semiconductor unit after the anodize expand step which is the basis of this invention. Aluminim layer 39 is anodized to develop aluminum oxide layer 42 which expands as it is formed at a higher rate than that of attrition shrinks slightly while its oxide layer 42 expands at a greater rate. The result of this controlled shrinkage and controlled expansion situation is that the metallic aluminum recedes from the PN junction between emitter 41 and base 34 during formation of oxide layer 42 which thus covers the junction. The emitter window need not be any particular shape since the window itself forms the mask for the emitter implantation and the emitter base protective oxide coating.

FIG. 3.11 shows the same semiconductor unit after the additional steps of cleaning, dip etching and metallizing the total surface with aluminum layer 43 which forms the emitter contact and interconnections.

FIG. 3.12 shows the same semiconductor unit after the additional photoresist, expose and etch step to provide the emitter contact the interconnection pattern. A portion of photoresist 44 remains in place where it has been used to define the emitter contact and interconnection metallization.

FIG. 3.13 shows the same semiconductor unit with the photoresist stripped off and the emitter metallization 43 anodized with protective layer of aluminum oxide 45.

FIG. 3.14 shows the same semiconductor unit with additional photoresist layer 46 after the photoresist, expose and etch step. A window has been opened through all of the layers of metallization and oxide to the surface of oxide layer 35.

FIG. 3.15 shows the same semiconductor unit with the photoresist layer 46 stripped off and a layer 47 of aluminum has been applied to the entire surface. Aluminum metallization layer 47 makes contact through a window in anodized oxide layer 38 to collector metallization layer 37. Similar connections between aluminum layer 47 and emitter metallization 43 and base metallization 39 where required are made at the same time and in the same fashion.

FIG. 3.16 shows the same semiconductor unit after a photoresist layer 48 has been applied, exposed and etched to provide the desired interconnection pattern.

FIG. 3.17 shows the same semiconductor unit after photoresist layer 48 has been stripped off and the exposed aluminum metallization pattern 47 anodized to provide a protective aluminum oxide layer 49.

Additional layers of aluminum metallization for special interconnections may be applied with conventional photoresist and etch techniques to provide the necessary interconnections between the various circuit elements. Each such aluminum layer may be protected by an anodized aluminum oxide coating by repeating the steps as shown in FIGS. 3.14/3.15/3.16/ and 3.17.

Field effect transistors, or complex semiconductors of various kinds may be made by use of the method, so long as adjacent regions are desired with very closely controlled widths of one region.

While this invention has been particularly described with reference to preferred embodiments thereof, it will be understood by those skilled in the art that the foregoing and other changes in form and details may be made therein without departing from the spirit and scope of the invention.

What is claimed:

1. A semiconductor device having a first semiconductor region and a second semiconductor region of differing conductivity types arrayed with a common junction extending to a common surface, an insulation layer on said common surface, said device characterized by an oxidized metallization pattern arrayed over said common surface, said metallization pattern including a conductive portion in direct contact with at least a portion of said first region on said common surface through said insulation layer, and an insulating oxide portion over said conductive portion, said insulating oxide portion extending to said common surface and overlying said common junction and extending over said second region a distance less than the finite thickness of said insulating oxide thickness.

2. The semiconductor device of claim 1 wherein said conductive portion of said metallization pattern is Al, and said insulating oxide is $Al_2O_3$.

3. The semiconductor device of claim 1 wherein said first semiconductor region constitutes the base of a transistor, and said second semiconductor region constitutes the emitter.

4. The semiconductor device of claim 1 wherein said second semiconductor region is comprised of implanted impurity ions.

* * * * *